US010879349B2

(12) United States Patent
Oka et al.

(10) Patent No.: US 10,879,349 B2
(45) Date of Patent: *Dec. 29, 2020

(54) METHOD FOR MANUFACTURING SEMICONDUCTOR DEVICE AND EDGE TERMINATION STRUCTURE OF SEMICONDUCTOR DEVICE

(71) Applicant: TOYODA GOSEI CO., LTD., Kiyosu (JP)

(72) Inventors: Tohru Oka, Kiyosu (JP); Nariaki Tanaka, Kiyosu (JP); Junya Nishii, Kiyosu (JP)

(73) Assignee: TOYODA GOSET CO., LTD., Kiyosu (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/920,246

(22) Filed: Mar. 13, 2018

(65) Prior Publication Data

US 2018/0286945 A1    Oct. 4, 2018

(30) Foreign Application Priority Data

Mar. 28, 2017    (JP) .................................. 2017-062678

(51) Int. Cl.
*H01L 29/06*    (2006.01)
*H01L 21/225*    (2006.01)
(Continued)

(52) U.S. Cl.
CPC ...... *H01L 29/0626* (2013.01); *H01L 21/2258* (2013.01); *H01L 21/266* (2013.01);
(Continued)

(58) Field of Classification Search
CPC ............. H01L 29/0623; H01L 29/7811; H01L 21/265; H01L 21/26553; H01L 21/046; H01L 21/32145
See application file for complete search history.

(56) References Cited

U.S. PATENT DOCUMENTS 3,793,088 A * 2/1974 Eckton, Jr. ........ H01L 21/82285
438/322
5,910,669 A   6/1999 Chang et al.
(Continued)

FOREIGN PATENT DOCUMENTS

JP    H06-224437 A    8/1994
JP    2001-267570 A    9/2001
(Continued)

OTHER PUBLICATIONS

IEEE Electron Device Letters, vol. 37, No. 4 Apr. 2016 p. 463-466.
(Continued)

*Primary Examiner* — Stephen M Bradley
(74) *Attorney, Agent, or Firm* — McGinn I.P. Law Group, PLLC.

(57) ABSTRACT

A method for manufacturing a semiconductor device having a edge termination region comprises a stacking process, an ion implantation process, and a heat treatment process. In the stacking process, a p-type semiconductor layer containing a p-type impurity is stacked on an n-type semiconductor layer containing an n-type impurity. In the ion implantation process, at least one of the n-type impurity and the p-type impurity is ion-implanted into the p-type semiconductor layer located in the edge termination region. The ion implantation process and the heat treatment process are performed such that the p-type impurity of the p-type semiconductor layer is diffused into the n-type semiconductor layer to form a p-type impurity containing region in at least part of the n-type semiconductor layer and below a region of the p-type semiconductor layer into which the ion implantation has been performed.

18 Claims, 12 Drawing Sheets

(51) Int. Cl.
*H01L 29/20* (2006.01)
*H01L 29/207* (2006.01)
*H01L 21/265* (2006.01)
*H01L 21/266* (2006.01)
*H01L 29/739* (2006.01)
*H01L 29/78* (2006.01)

(52) U.S. Cl.
CPC .... *H01L 21/26546* (2013.01); *H01L 29/0623* (2013.01); *H01L 29/2003* (2013.01); *H01L 29/207* (2013.01); *H01L 29/7397* (2013.01); *H01L 29/7811* (2013.01); *H01L 29/7813* (2013.01)

(56) References Cited

U.S. PATENT DOCUMENTS

| | | | |
|---|---|---|---|
| 10,153,356 B2* | 12/2018 | Oka | H01L 21/26553 |
| 2008/0116512 A1* | 5/2008 | Kawaguchi | H01L 29/0634 257/334 |
| 2008/0315301 A1* | 12/2008 | Takemori | H01L 29/7813 257/331 |
| 2009/0114969 A1 | 5/2009 | Suzuki et al. | |
| 2009/0230515 A1* | 9/2009 | Miyahara | H01L 29/0878 257/632 |
| 2009/0302376 A1 | 12/2009 | Inoue et al. | |
| 2012/0032305 A1* | 2/2012 | Kitamura | H01L 29/167 257/607 |
| 2012/0153355 A1 | 6/2012 | Umeda et al. | |
| 2012/0199889 A1 | 8/2012 | Miyamoto et al. | |
| 2013/0285140 A1 | 10/2013 | Kagawa et al. | |
| 2014/0377942 A1 | 12/2014 | Noguchi et al. | |
| 2015/0008446 A1* | 1/2015 | Losee | H01L 21/046 257/77 |
| 2015/0129895 A1* | 5/2015 | Takeuchi | H01L 21/0475 257/77 |
| 2016/0308037 A1 | 10/2016 | Sakata | |
| 2017/0025524 A1 | 1/2017 | Kinoshita et al. | |
| 2017/0148882 A1* | 5/2017 | Yoshikawa | H01L 21/045 |
| 2017/0263701 A1 | 9/2017 | Oka et al. | |
| 2017/0288014 A1* | 10/2017 | Saito | H01L 29/7397 |
| 2018/0151366 A1* | 5/2018 | Endo | H01L 21/265 |

FOREIGN PATENT DOCUMENTS

| | | |
|---|---|---|
| JP | 2008-135522 A | 6/2008 |
| JP | 2009-117593 A | 5/2009 |
| JP | 2009-141185 A | 6/2009 |
| JP | 2009-289904 A | 12/2009 |
| JP | 2016-021460 A | 2/2016 |
| JP | 2016-225455 A | 12/2016 |
| WO | WO 2007/060716 A1 | 5/2007 |
| WO | WO 2011/024549 A1 | 3/2011 |
| WO | WO 2016/002963 A1 | 1/2016 |
| WO | WO-2016092896 A1 * | 6/2016 ......... H01L 29/7397 |
| WO | WO-2016194280 A1 * | 12/2016 ......... H01L 21/265 |

OTHER PUBLICATIONS

United States Office Action dated Dec. 5, 2017 in U.S. Pat. No. 10,153,356.
United States Final Office Action dated May 11, 2018 in U.S. Pat. No. 10,153,356.
United States Notice of Allowance dated Aug. 7, 2018 in U.S. Pat. No. 10,153,356.
Japanese Notification of Reasons for Refusal dated Feb. 5, 2019 in corresponding Japanese Patent Application No. 2016-059903, with an English translation thereof.
Notification of Reasons for Refusal, dated Mar. 10, 2020, in Japanese Application No. 2017-062678 and English Translation thereof.
Notice of Reasons for Refusal dated Jun. 30, 2020, in Japanese Application No. 2017-062678 and English Translation thereof.

* cited by examiner

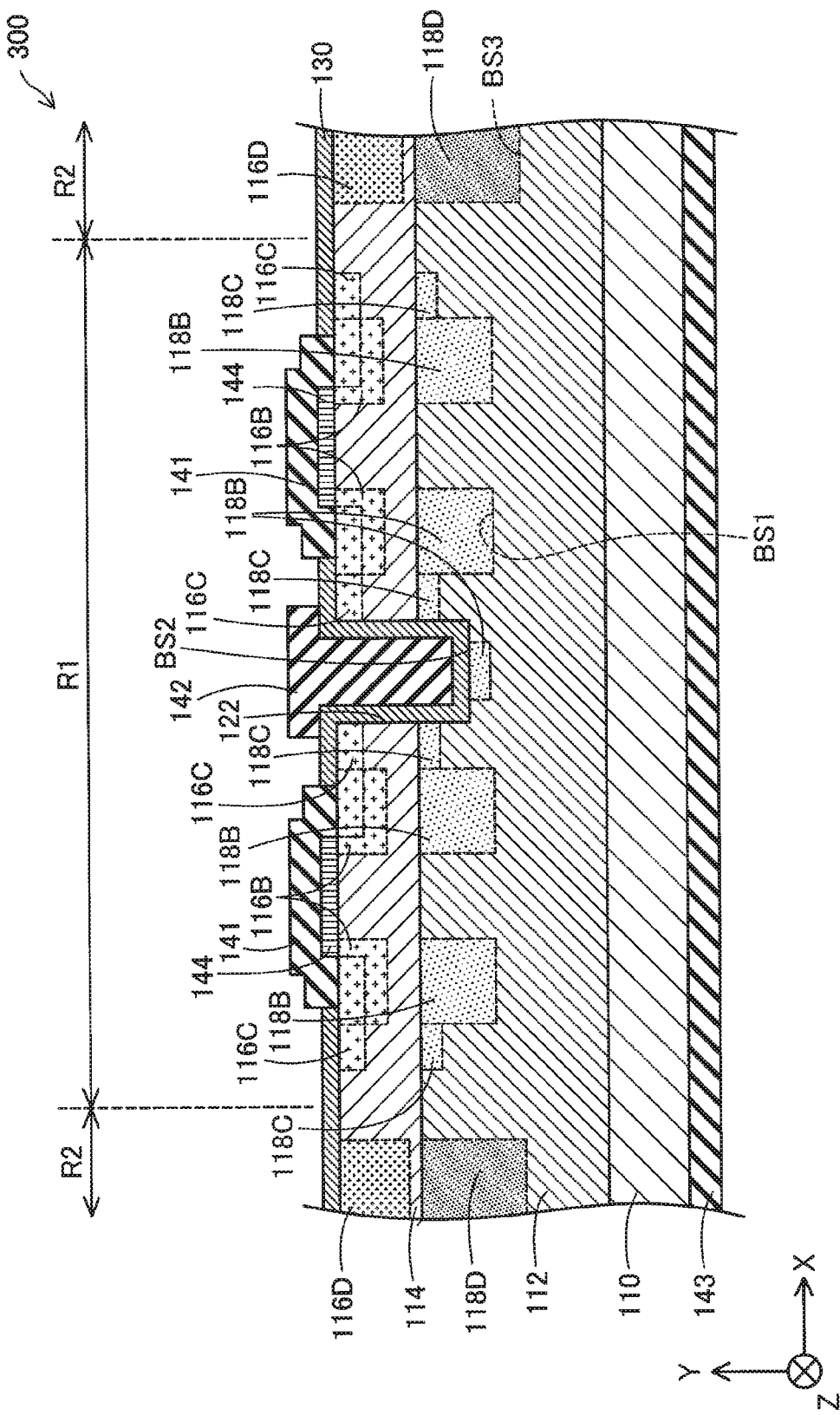

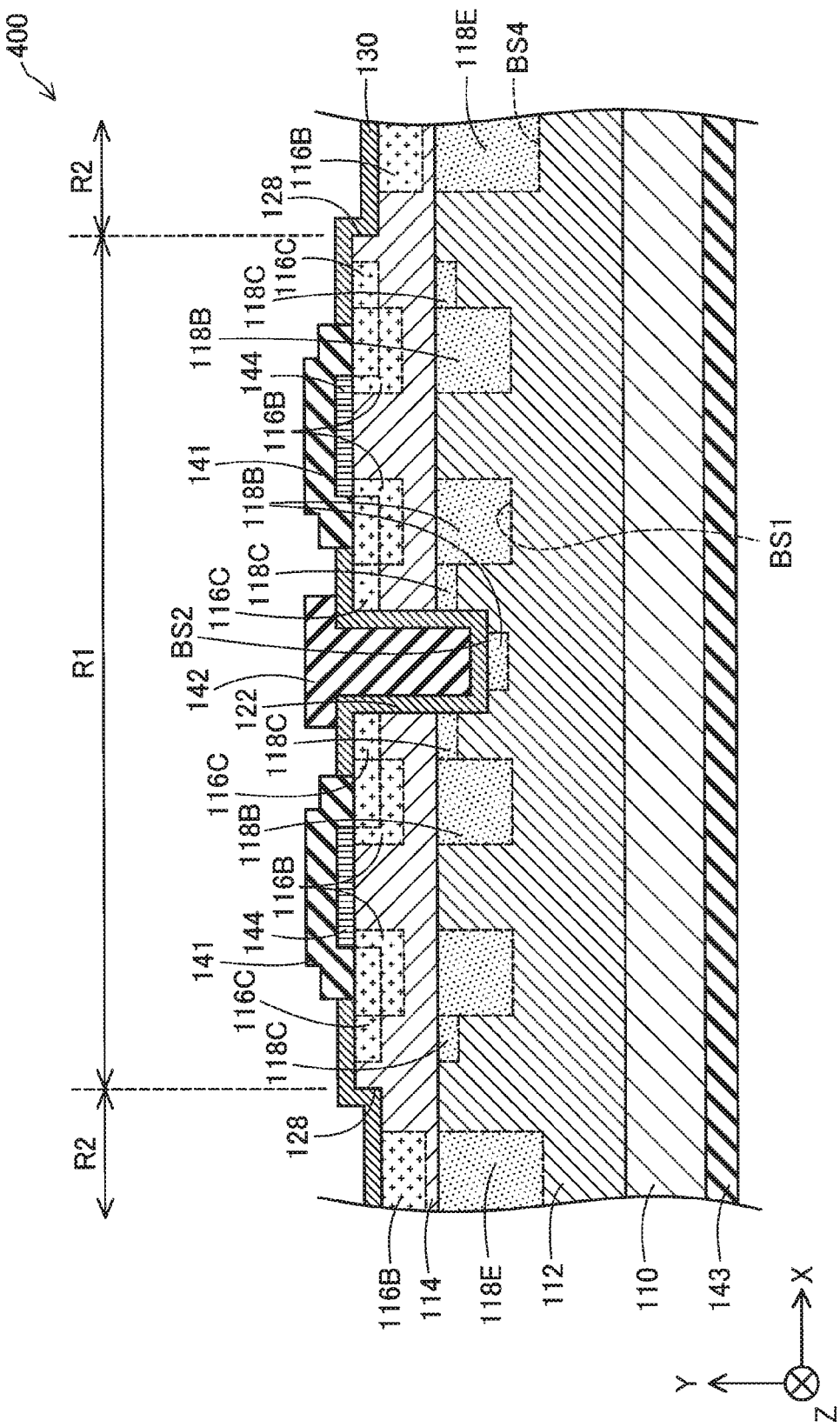

METHOD FOR MANUFACTURING SEMICONDUCTOR DEVICE AND EDGE TERMINATION STRUCTURE OF SEMICONDUCTOR DEVICE

CROSS-REFERENCE TO RELATED APPLICATION

This application claims priority to Japanese Patent Application No. 2017-062678 filed on Mar. 28, 2017, the entire contents of which are incorporated by reference herein.

BACKGROUND

Technical Field

The present disclosure relates to a method for manufacturing a semiconductor device, and a edge termination structure of the semiconductor device.

Related Art

Conventionally, semiconductor devices for power control (power devices) have been known for including a edge termination structure such as a guard ring around an device cell region (active region) to improve breakdown voltage and suppress potential crowding. JP-A-2008-135522 discloses a method in which ion implantation is performed to form a p-type impurity containing region in an n-type semiconductor layer so as to form a edge termination structure.

When ion implantation is adopted to form the p-type impurity containing region in the n-type semiconductor layer, however, the ion implantation may cause a defect of crystal in the semiconductor, and there may be difficult cases in which it is unlikely to recover the defect of crystal even by heat treatment. In view of this, there has been a need for a technique of forming the p-type impurity containing region in the n-type semiconductor layer in the edge termination structure without ion implantation of the p-type impurity into the n-type semiconductor layer.

SUMMARY

The present disclosure has been achieved to at least partly solve the circumstances described above. The present disclosure is implementable in accordance with the following aspects.

(1) According to one aspect of the present disclosure, there is provided a method for manufacturing a semiconductor device having a edge termination region. The method for manufacturing the semiconductor device comprises a stacking process, an ion implantation process, and a heat treatment process. In the stacking process, a p-type semiconductor layer containing a p-type impurity is stacked on an n-type semiconductor layer containing an n-type impurity. In the ion implantation process, at least one of the n-type impurity and the p-type impurity is ion-implanted into the p-type semiconductor layer located in the edge termination region. In the heat treatment process, heat treatment is performed to activate the ion-implanted impurity. The ion implantation process and the heat treatment process are performed such that the p-type impurity of the p-type semiconductor layer is diffused into the n-type semiconductor layer to form a p-type impurity containing region in at least part of the n-type semiconductor layer and below a region of the p-type semiconductor layer into which the ion implantation has been performed. The method for manufacturing the semiconductor device according to this aspect ensures that the p-type impurity containing region is formed in the n-type semiconductor layer located in the edge termination region without ion implantation of the p-type impurity into the n-type semiconductor layer.

(2) The method for manufacturing the semiconductor device according to the above-described aspect may further comprise a trench forming process that forms a trench that is recessed to pass through the p-type semiconductor layer and reach the n-type semiconductor layer. In a stacking direction of the n-type semiconductor layer and the p-type semiconductor layer, a bottom face of the p-type impurity containing region may be located to be coplanar with a bottom face of the trench or below the bottom face of the trench. The method for manufacturing the semiconductor device according to this aspect ensures that avalanche breakdown is caused in the edge termination structure before the trench is broken by the potential crowding in the vicinity of the trench. This improves breakdown voltage of the semiconductor device.

(3) In the semiconductor device according to the above-described aspect, the n-type semiconductor layer and the p-type semiconductor layer may be made of a Group III nitride. Even if it is difficult to make, for example, a Group III nitride such as gallium nitride (GaN) have p-type conductivity by ion implantation of a p-type impurity, the method for manufacturing the semiconductor device according to this aspect ensures that the p-type impurity containing region is formed in the n-type semiconductor layer located in the edge termination region without ion implantation of the p-type impurity into the type semiconductor layer.

(4) According to the other aspect of the present disclosure, there is provided a edge termination structure of a semiconductor device. The edge termination structure of the semiconductor device comprises an n-type semiconductor layer, a p-type semiconductor layer, a first region, and a p-type impurity containing region. The n-type semiconductor layer contains an n-type impurity. The p-type semiconductor layer is formed on the n-type semiconductor layer and contains a p-type impurity. The first region is formed in the p-type semiconductor layer and contains a larger amount of at least one of the n-type impurity and the p-type impurity than the other region of the p-type semiconductor layer. The p-type impurity containing region is formed in the n-type semiconductor layer and below the first region, and contains the p-type impurity. Since the edge termination structure of the semiconductor device according to this aspect comprises the p-type impurity containing region, breakdown voltage of the semiconductor device is improved.

The present disclosure may be implemented in various modes other than the method for manufacturing the semiconductor device having the edge termination region, and the edge termination structure of the semiconductor device. For example, the present disclosure is implementable in such a mode as an apparatus of manufacturing the semiconductor device utilizing the above-described manufacturing method.

The method for manufacturing the semiconductor device according to the present disclosure ensures that the p-type impurity containing region is formed in the n-type semiconductor layer located in the edge termination region without ion implantation of the p-type impurity into the n-type semiconductor layer. Moreover, since the edge termination structure of the semiconductor device according to the present disclosure comprises the p-type impurity containing region, breakdown voltage of the semiconductor device is effectively improved.

BRIEF DESCRIPTION OF DRAWINGS

FIG. 10 is a sectional view of a semiconductor device according to a seventh embodiment, schematically illustrating its configuration, FIG. 11 is a sectional view of a semiconductor device according to an eighth embodiment, schematically illustrating its configuration.

DESCRIPTION OF EMBODIMENTS

A. First Embodiment

A-1. Configuration of Semiconductor Device

Figure 1:
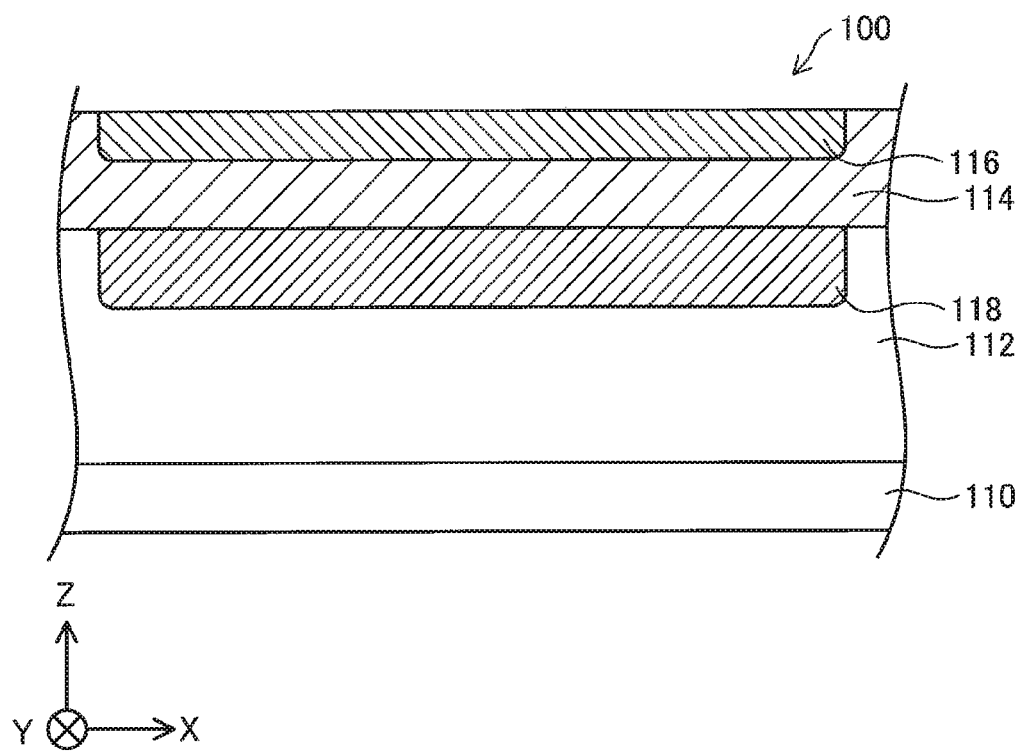
FIG. 1 is a sectional view of a semiconductor device according to a first embodiment, schematically illustrating its configuration.

FIG. 1 is a sectional view of a semiconductor device 100 according to a first embodiment, schematically illustrating a configuration of a edge termination structure and its vicinity of the semiconductor device 100. The semiconductor device 100 is a GaN-based semiconductor device formed using gallium nitride (GaN).

XYZ-axes orthogonal to one another are illustrated in FIG. 1. Among the XYZ-axes of FIG. 1, the X-axis denotes a left-right axis on the sheet surface of FIG. 1. +X-axis direction denotes a rightward direction on the sheet surface, and −X-axis direction denotes a leftward direction on the sheet surface. Among the XYZ-axes of FIG. 1, the Y-axis denotes a front-back axis on the sheet surface of FIG. 1. +Y-axis direction denotes a backward direction on the sheet surface, and −Y-axis direction denotes a forward direction on the sheet surface. Among the XYZ-axes of FIG. 1, the Z-axis denotes a bottom-top axis on the sheet surface of FIG. 1. +Z-axis direction denotes an upward direction on the sheet surface, and −Z-axis direction denotes a downward direction on the sheet surface.

The semiconductor device 100 includes a substrate 110, an n-type semiconductor layer 112, a p-type impurity containing region 118, a p-type semiconductor layer 114, and an ion-implanted region 116. In this embodiment, a edge termination region of the semiconductor device 100 is illustrated in the drawings. Here, the edge termination region refers to an outer peripheral portion of the semiconductor chip, and refers to an outer peripheral portion of the active region.

The substrate 110 of the semiconductor device 100 is a plate-shaped semiconductor extended along the X-axis and the Y-axis. In this embodiment, the substrate 110, the n-type semiconductor layer 112, and the p-type semiconductor layer 114 are made of a Group III nitride semiconductor. As the Group III nitride semiconductor, for example, gallium nitride (GaN), aluminum nitride (AlN), aluminum gallium nitride (AlGaN), indium gallium nitride (InGaN), and indium aluminum gallium nitride (InAlGaN) may be used. In view of use for the semiconductor device for power control, gallium nitride (GaN) and aluminum gallium nitride (AlGaN) are preferable as the Group III nitride semiconductor. In this embodiment, gallium nitride (GaN) is used as the Group III nitride semiconductor. It should be noted that insofar as the effects of this embodiment can be obtained, part of gallium nitride (GaN) may be replaced with other Group III elements such as aluminum (Al) and indium (In), and that gallium nitride (GaN) may contain other impurities.

In this embodiment, the substrate 110 is an n-type semiconductor layer containing silicon (Si) as an n-type impurity. In this embodiment, the substrate 110 has an average concentration of silicon (Si) of $1.0\times10^{18}$ cm$^{-3}$.

The n-type semiconductor layer 112 of the semiconductor device 100 is a semiconductor layer located on a +Z-axis direction side of the substrate 110 and extended along the X-axis and the Y-axis. In this embodiment, the n-type semiconductor layer 112 is an n-type semiconductor layer containing silicon (Si) as an n-type impurity. Preferably, the n-type semiconductor layer 112 has an average concentration of silicon (Si) of $1.0\times10^{15}$ cm$^{-3}$ or more and $1.0\times10^{17}$ cm$^{-3}$ or less. In this embodiment, the n-type semiconductor layer 112 has an average concentration of silicon (Si) of $1.0\times10^{16}$ cm$^{-3}$, which is lower than the average concentration of silicon (Si) of the substrate 110. Preferably, the n-type semiconductor layer 112 has a thickness (dimension in the Z-axis direction) of 3 μm or more and 30 μm or less. In this embodiment, the thickness of the n-type semiconductor layer 112 is 10 μm.

The p-type impurity containing region 118 of the semiconductor device 100 is a partial region of the n-type semiconductor layer 112 on the +Z-axis direction side. In this embodiment, the p-type impurity containing region 118 contains a p-type impurity of $2.0\times10^{17}$ cm$^{-3}$ or more, and equal to or less than the p-type impurity concentration of the p-type semiconductor layer 114. The p-type impurity containing region 118 is a semiconductor region extended along the X-axis and the Y-axis. In this embodiment, the p-type impurity concentration of the p-type impurity containing region 118 is lower than the p-type impurity concentration of the p-type semiconductor layer 114. In this embodiment, the p-type impurity containing region 118 contains silicon (Si) as an n-type impurity, and also contains magnesium (Mg) as a p-type impurity.

The p-type impurity containing region 118 has a top face (face on the +Z-axis direction side) in contact with the p-type semiconductor layer 114. The p-type impurity containing region 118 is located below the ion-implanted region 116, and is to be formed in an ion-implanted region forming process, described later. Here, "being located below the ion-implanted region 116" refers to being located more on the n-type semiconductor layer 112 side (−Z-axis direction side) than on the p-type semiconductor layer 114 side in the stacking direction (Z-axis direction) of the n-type semiconductor layer 112 and the p-type semiconductor layer 114, and also refers to being at least partly overlapped with the ion-implanted region 116 as viewed in the stacking direction (Z-axis direction). The thickness (dimension in the Z-axis direction) of the p-type impurity containing region 118 has a correlation with the thickness and the concentration of the ion-implanted region 116. In this embodiment, the thickness of the p-type impurity containing region 118 is equal to or less than 1.0 μm.

The p-type semiconductor layer 114 of the semiconductor device 100 is a semiconductor layer located on (the +Z-axis direction side of) the n-type semiconductor layer 112, and extended along the X-axis and the Y-axis. In this embodiment, the p-type semiconductor layer 114 is a p-type semiconductor layer containing a p-type impurity. As the p-type impurity, for example, at least one of magnesium (Mg), zinc (Zn), beryllium (Be), and carbon (C) may be used. In this embodiment, the p-type semiconductor layer 114 contains magnesium (Mg) as the p-type impurity.

The p-type semiconductor layer 114 has an average concentration of magnesium (Mg) of $4.0 \times 10^{18}$ cm$^{-3}$. In this embodiment, the thickness (dimension in the Z-axis direction) of the p-type semiconductor layer 114 is equal to or less than 1.0 μm. In this embodiment, as viewed in the stacking direction of the n-type semiconductor layer 112 and the p-type semiconductor layer 114, the portion of the p-type semiconductor layer 114 that is overlapped with the p-type impurity containing region 118 has an average concentration of the p-type impurity lower than the portion of the p-type semiconductor layer 114 that is not overlapped with the p-type impurity containing region 118.

The ion-implanted region 116 of the semiconductor device 100 is a partial region of the p-type semiconductor layer 114 on the +Z-axis direction side. The ion-implanted region 116 is a semiconductor region extended along the X-axis and the Y-axis. As compared with the other region of the p-type semiconductor layer 114, the ion-implanted region 116 contains a larger amount of at least one of the n-type impurity and the p-type impurity. The ion-implanted region 116 will be also referred to as first region. In this embodiment, as compared with the other region of the p-type semiconductor layer 114, the ion-implanted region 116 contains a larger amount of the p-type impurity. It should be noted that as compared with the other region of the p-type semiconductor layer 114, the ion-implanted region 116 may contain a larger amount of the n-type impurity.

In this embodiment, the ion-implanted region 116 is formed by ion-implanting magnesium (Mg) into the partial region of the p-type semiconductor layer 114 on the +Z-axis direction side. It should be noted that as the p-type impurity for ion implantation, for example, at least one of magnesium (Mg), zinc (Zn), and carbon (C) may be used. In this embodiment, as the p-type impurity for ion implantation, magnesium (Mg) is used. In this embodiment, the ion-implanted region 116 has a p-type impurity concentration of $4.0 \times 10^{18}$ cm$^{-3}$ or more. In this embodiment, the thickness (dimension in the Z-axis direction) of the ion-implanted region 116 is equal to or less than 0.3 μm. It should be noted that the ion-implanted region 116 may be formed by ion implantation of silicon (Si), which is an n-type impurity.

A-2. Method for Manufacturing Semiconductor Device

Figure 2:
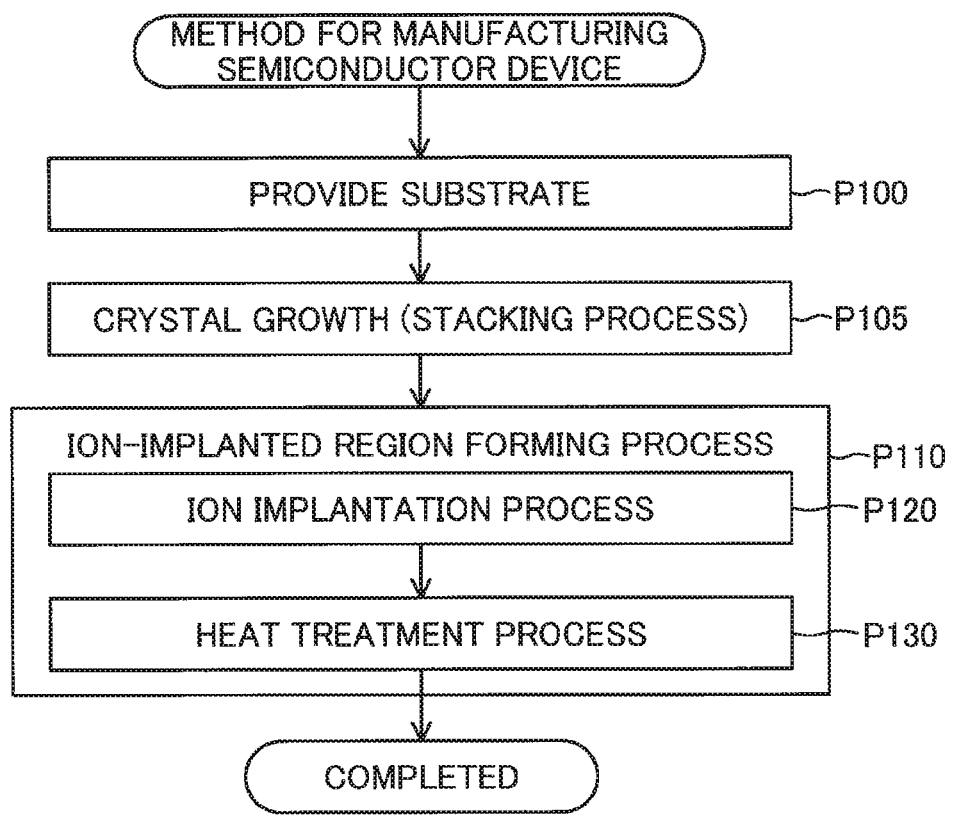
FIG. 2 is a process chart of a method for manufacturing the semiconductor device according to the first embodiment.

FIG. 2 is a process chart of a method for manufacturing the semiconductor device 100 according to the first embodiment. First, the manufacturer provides the substrate 110 (process P100). In this embodiment, the substrate 110 is made of gallium nitride (GaN).

Next, the manufacturer performs crystal growth (process P105). Specifically, the manufacturer performs the following two processes: (i) a process of stacking the n-type semiconductor layer 112 on the substrate 110; and (ii) a process of stacking the p-type semiconductor layer 114 on the n-type semiconductor layer 112. In this embodiment, as the technique of crystal growth, the manufacturer adopts metal organic chemical vapor deposition (MOCVD). Process P105 will be also referred to as a stacking process.

In this embodiment, the substrate 110 and the n-type semiconductor layer 112 are made of the n-type semiconductor containing silicon (Si) as a donor element. The p-type semiconductor layer 114 is a p-type semiconductor containing magnesium (Mg) as an acceptor element.

After the stacking process (process P105), the manufacturer forms the ion-implanted region 116 in the partial region of the p-type semiconductor layer 114 (process P110). Process P110 will be also referred to as ion-implanted region forming process. The ion-implanted region forming process (process P110) includes the following two processes: (i) an ion implantation process (process P120) that implants at least one of the n-type impurity and the p-type impurity into the p-type semiconductor layer 114 located in the edge termination region; and (ii) a heat treatment process (process P130) that performs heat treatment to activate the impurity thus ion-implanted. Process P120 will be also referred to as ion implantation process, and process P130 will be also referred to as heat treatment process.

In this embodiment, the manufacturer ion-implants the p-type impurity into the p-type semiconductor layer 114 (process P120). In this embodiment, the manufacturer uses magnesium (Mg) as the p-type impurity to be ion-implanted into the p-type semiconductor layer 114. It should be noted that instead of ion implantation of the p-type impurity, ion implantation of an n-type impurity may be performed. Both the ion implantation of the p-type impurity and the ion implantation of the n-type impurity may be performed.

Specifically, the manufacturer first forms a film 210 on the p-type semiconductor layer 114. The film 210 is used to adjust a distribution of the impurity, which is implanted by ion implantation, in the depth direction of the p-type semiconductor layer 114. In other words, the film 210 is used to gather the element implanted in the p-type semiconductor layer 114, to the vicinity of the surface of the p-type semiconductor layer 114. The film 210 also serves to prevent the surface of the p-type semiconductor layer 114 from being damaged by ion implantation. In this embodiment, preferably, the film 210 is made of such a material as not to become a donor when implanted in the p-type semiconductor layer 114. As the material of the film 210, for example, a Group III nitride semiconductor such as aluminum nitride (AlN), aluminum gallium nitride (AlGaN), and boron nitride (BN) may be used. In this embodiment, the manufacturer adopts metal organic chemical vapor deposition (MOCVD) to form the film 210.

Next, the manufacturer forms a mask 220 on part of the film 210. The mask 220 is formed above a region of the p-type semiconductor layer 114 in which no ion implantation is performed. In this embodiment, the manufacturer uses a photoresist to form the mask 220. In this embodiment, the mask 220 has a film thickness of approximately 2 μm.

The manufacturer subsequently performs the ion implantation from the upper side of the p-type semiconductor layer 114. In this embodiment, the manufacturer ion-implants magnesium (Mg) into the p-type semiconductor layer 114. The dose amount at the time of ion implantation is, preferably, equal to or larger than $2.0 \times 10^{14}$ cm$^{-2}$ and equal to or less than $3.0 \times 10^{15}$ cm$^{-2}$, more preferably, equal to or larger than $1.0 \times 10^{15}$ cm$^{-2}$ and equal to or less than $3.0 \times 10^{15}$ cm$^{-2}$. Preferably, the manufacturer adjusts the accelerating voltage at the time of ion implantation to make the thickness of the ion-implanted region larger than 0 and equal to or less than 0.4 μm. The number of times of ion implantation may be once or may be a plurality of times. In view of prevention of the channeling effect at the time of ion implantation, preferably, an ion implantation angle is equal to or larger than 5° and equal to or less than 15° relative to the Z-axis direction. In this embodiment, the ion implantation angle is 9°. Preferably, the temperature of the substrate 110 at the time of ion implantation is equal to or higher than 20° C. and equal to or lower than 800° C. In this embodiment, the temperature of the substrate 110 at the time of ion implantation is 25° C.

Figure 3:
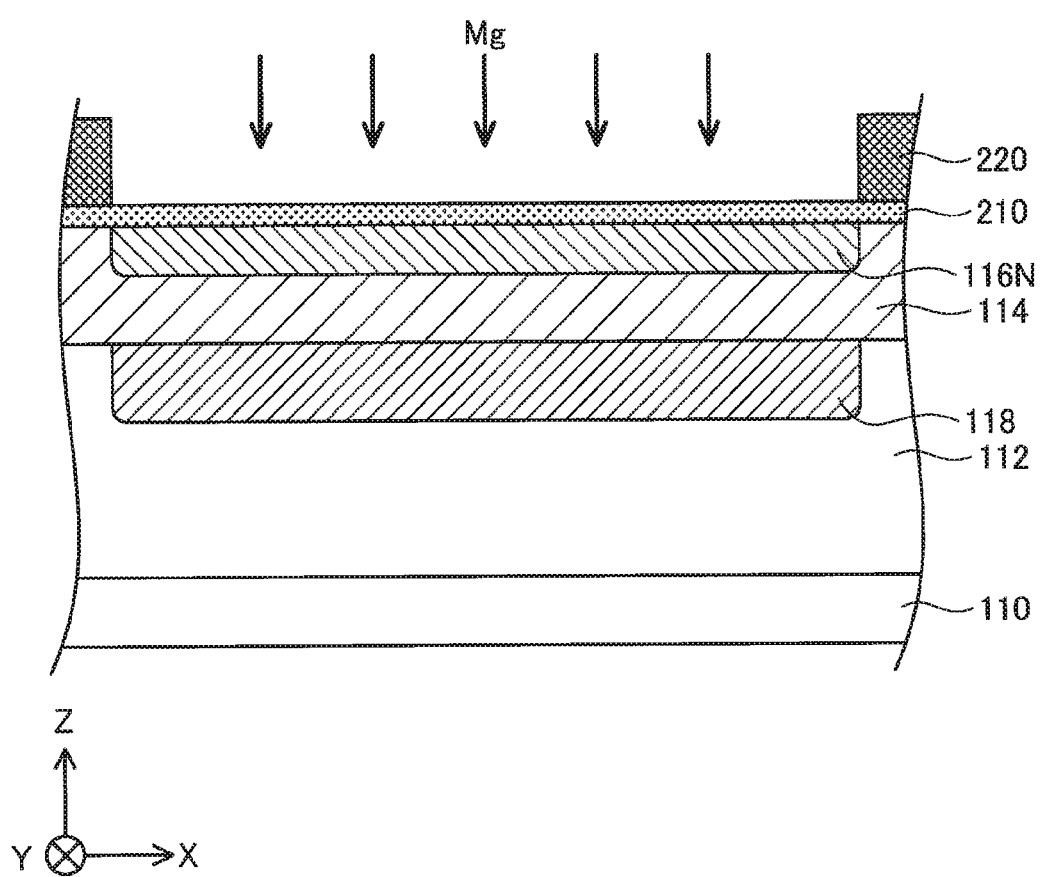
FIG. 3 is a sectional view of the semiconductor device, schematically illustrating a state of ion implantation in progress.

FIG. 3 is a sectional view of the semiconductor device, schematically illustrating a state of ion implantation in progress. As a result of the ion implantation, the element is implanted into a region of the p-type semiconductor layer 114 under the remaining part of the film 210 that is not covered with the mask 220. This region thus formed is an ion-implanted region 116N. The concentration of the p-type impurity in the ion-implanted region 116N is adjustable as desired by controlling the material and the film thickness of the film 210 and regulating the accelerating voltage and the dose amount of ion implantation. It should be noted that the p-type impurity implanted into the ion-implanted region 116N is not activated to serve as an acceptor element. Accordingly, the ion-implanted region 116N immediately after the ion implantation is a region of high resistance. Although the p-type impurity containing region 118 has not been formed yet in the ion implantation process, the p-type impurity containing region 118 is illustrated in FIG. 3 to describe a positional relationship between the ion-implanted region 116N and the p-type impurity containing region 118.

Next, the manufacturer removes the film 210 and the mask 220. In this embodiment, the manufacturer removes the film 210 and the mask 220 by wet etching. Thus, the ion implantation process (process P120 (see FIG. 2)) is completed.

After the ion implantation process (process P120), the manufacturer performs the heat treatment process (process P130) to activate the p-type impurity in the ion-implanted region 116N. In the heat treatment process (process P130), the manufacturer heats the ion-implanted region 116N to form the ion-implanted region 116 having p-type conductivity.

First, the manufacturer forms a cap film on the p-type semiconductor layer 114 and the ion-implanted region 116N. The cap film serves to prevent the surface of the p-type semiconductor layer 114 and the surface of the ion-implanted region 116N from being damaged by heating. The cap film also serves to prevent gallium (Ga) and nitrogen (N) from escaping from the p-type semiconductor layer 114. As a material of the cap film, nitrides are preferable. Examples include, but are not limited to, silicon nitride (SiN$_x$), aluminum nitride (AlN), aluminum gallium nitride (AlGaN), gallium nitride (GaN), and boron nitride (BN). The cap film may be formed by sputtering and metal organic chemical vapor deposition (MOCVD). In this embodiment, the manufacturer forms the cap film of aluminum nitride (AlN) by metal organic chemical vapor deposition.

Next, the manufacturer heats the p-type semiconductor layer 114 and the ion-implanted region 116N. The heating temperature of the p-type semiconductor layer 114 and the ion-implanted region 116N is, preferably, equal to or higher than 900° C. and equal to or lower than 1400° C., more preferably, equal to or higher than 1000° C. and equal to or lower than 1200° C. The heating time is, preferably, equal to or longer than 10 seconds and equal to or shorter than 10 minutes, and more preferably, equal to or longer than 10 seconds and equal to or shorter than 5 minutes. As an atmospheric gas at the time of the heat treatment, preferably, at least one of nitrogen (N), ammonia (NH$_3$), and argon (Ar) is used.

As a result of the heat treatment process, the ion-implanted region 116N becomes the ion-implanted region 116 having p-type conductivity. After undergoing the ion implantation process (process P120) and the heat treatment process (process P130), the p-type impurity containing region 118 is formed below the ion-implanted region 116 and in a region of the n-type semiconductor layer 112 on the +Z-axis direction side. That is, the p-type impurity containing region 118 is formed in part of the n-type semiconductor layer 112. The p-type impurity containing region 118 is formed by diffusion of the p-type impurity in the p-type semiconductor layer 114 into the n-type semiconductor layer 112. In this embodiment, as viewed in the stacking direction (Z-axis direction), the p-type impurity containing region 118 is at a location overlapped with the ion-implanted region 116.

The concentration of the p-type impurity in the p-type impurity containing region 118 is adjustable by regulating the accelerating voltage and the dose amount at the time of ion implantation (process P120) and regulating the heating temperature and the heating time in the heat treatment (process P130). For example, the accelerating voltage or the dose amount is increased at the time of ion implantation (process P120) so as to increase the concentration of the p-type impurity diffused in the p-type impurity containing region 118.

After the heat treatment, the manufacturer removes the cap film from the upper side of the p-type semiconductor layer 114 and the ion-implanted region 116. In this embodiment, the manufacturer removes the cap film by wet etching. Thus, the heat treatment process (process P130 (see FIG. 2)) is completed, and at the same time, the ion-implanted region forming process (process P110) is completed. The above-described series of processes makes the semiconductor device 100 complete.

A-3. Advantageous Effects

The method for manufacturing the semiconductor device 100 according to the first embodiment ensures that the p-type impurity containing region 118 is formed in the n-type semiconductor layer 112 located in the edge termination region in the ion-implanted region forming process (process P110) without ion implantation of the p-type impurity into the n-type semiconductor layer 112. As a result, the method for manufacturing the semiconductor device 100 according to the first embodiment improves breakdown voltage of the semiconductor device 100. In other words, since the edge termination structure of the semiconductor device 100 according to the first embodiment includes the p-type impurity containing region 118, breakdown voltage of the semiconductor device 100 is improved.

The method for manufacturing the semiconductor device 100 according to the first embodiment, which does not include ion implantation of the p-type impurity into the n-type semiconductor layer 112, prevents irregularity in the crystal structure of the n-type semiconductor layer 112, which may be caused by the ion implantation of the p-type impurity.

In the semiconductor device 100 according to the first embodiment, the p-type impurity containing region 118 is in contact with the p-type semiconductor layer 114. Consequently, in the heat treatment process for activating magnesium (Mg), which is the p-type impurity in the p-type semiconductor layer 114, magnesium (Mg), which is the p-type impurity in the p-type impurity containing region 118, is also activated. That is, in this process, hydrogen in the p-type impurity containing region 118 is eliminated outside through the p-type semiconductor layer 114. This ensures that the p-type impurity in the p-type semiconductor layer 114 and the p-type impurity containing region 118 is activated at once so as to facilitate manufacturing the semiconductor device 100 according to the first embodiment.

B. Second Embodiment

Figure 4:
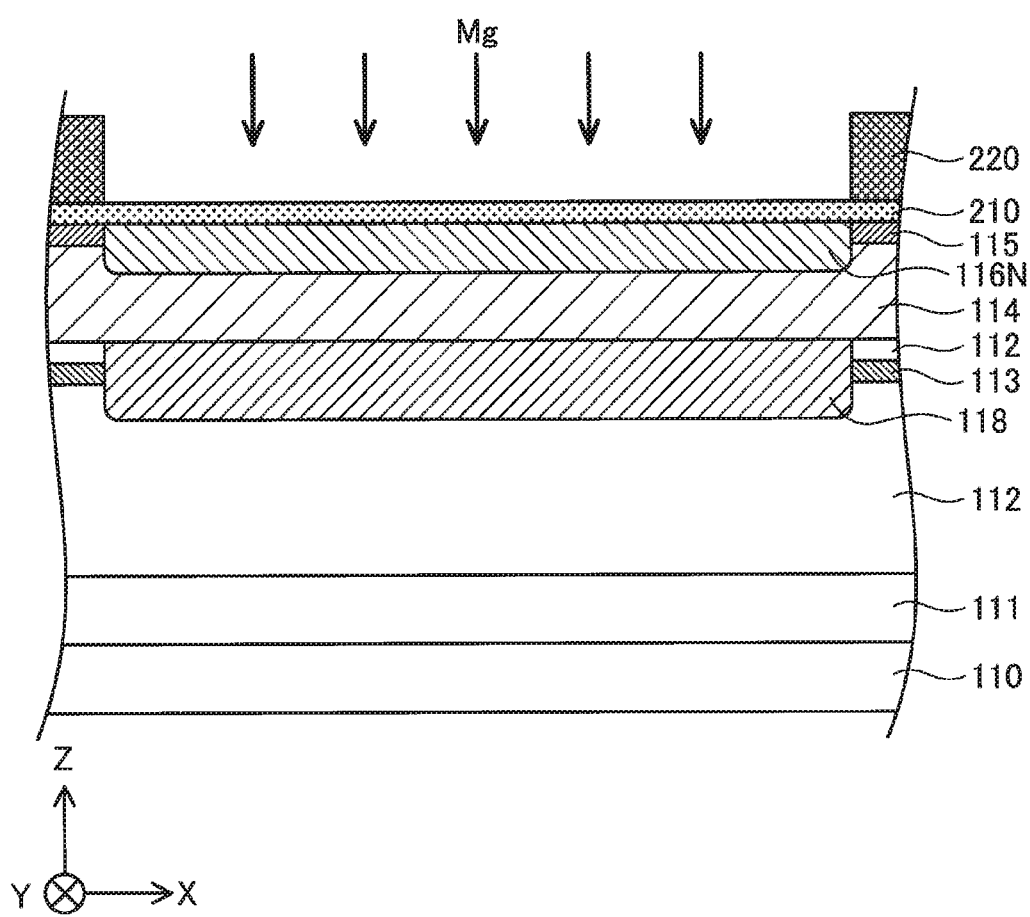
FIG. 4 is a sectional view of a semiconductor device according to a second embodiment, schematically illustrating a state of ion implantation in progress.

FIG. 4 is a sectional view of a semiconductor device according to a second embodiment, schematically illustrating a state of ion implantation in progress. The semiconductor device according to the second embodiment differs from the semiconductor device 100 according to the first embodiment by further including the following three elements: (i) an n-type semiconductor layer 111 interposed between the substrate 110 and the n-type semiconductor layer 112 and having an n-type impurity concentration higher than the n-type semiconductor layer 112; (ii) an n-type semiconductor layer 113 disposed in the n-type semiconductor layer 112 in such a manner as to intersect the p-type impurity containing region 118 and having an n-type impurity concentration higher than the n-type semiconductor layer 112; and (iii) an n-type semiconductor layer 115 disposed on the p-type semiconductor layer 114 and having an n-type impurity concentration higher than the n-type semiconductor layer 112. Otherwise, the semiconductor device according to the second embodiment is similar to the semiconductor device 100 according to the first embodiment. It should be noted that although the n-type semiconductor layer 113 intersects the p-type impurity containing region 118 in FIG. 4, the n-type semiconductor layer 113 may be disposed below the p-type impurity containing region 118. It should be also noted that at least one of the n-type semiconductor layer 111, the n-type semiconductor layer 113, and the n-type semiconductor layer 115 may be omitted. Any of the n-type semiconductor layer 111, the n-type semiconductor layer 113, and the n-type semiconductor layer 115 has an impurity concentration of $1.0 \times 10^{17}$ cm$^{-3}$ or higher, and a thickness of 0.1 µm to 1 µm. In this embodiment, the n-type semiconductor layer 111 may be utilized as a contact layer for forming a drain electrode when electrode formation on the substrate 110 involves difficulty. The n-type semiconductor layer 115 may be utilized as a contact layer for forming a source electrode. The n-type semiconductor layer 113 prevents built-in potential from the p-type impurity containing region 118 from depleting the n-type semiconductor layer 112 and hindering electron transfer.

A method for manufacturing the semiconductor device according to the second embodiment also ensures that the p-type impurity containing region 118 is formed in the n-type semiconductor layer 112 located in the edge termination region without ion implantation of the p-type impurity into the n-type semiconductor layer 112.

C. Third Embodiment

Figure 5:
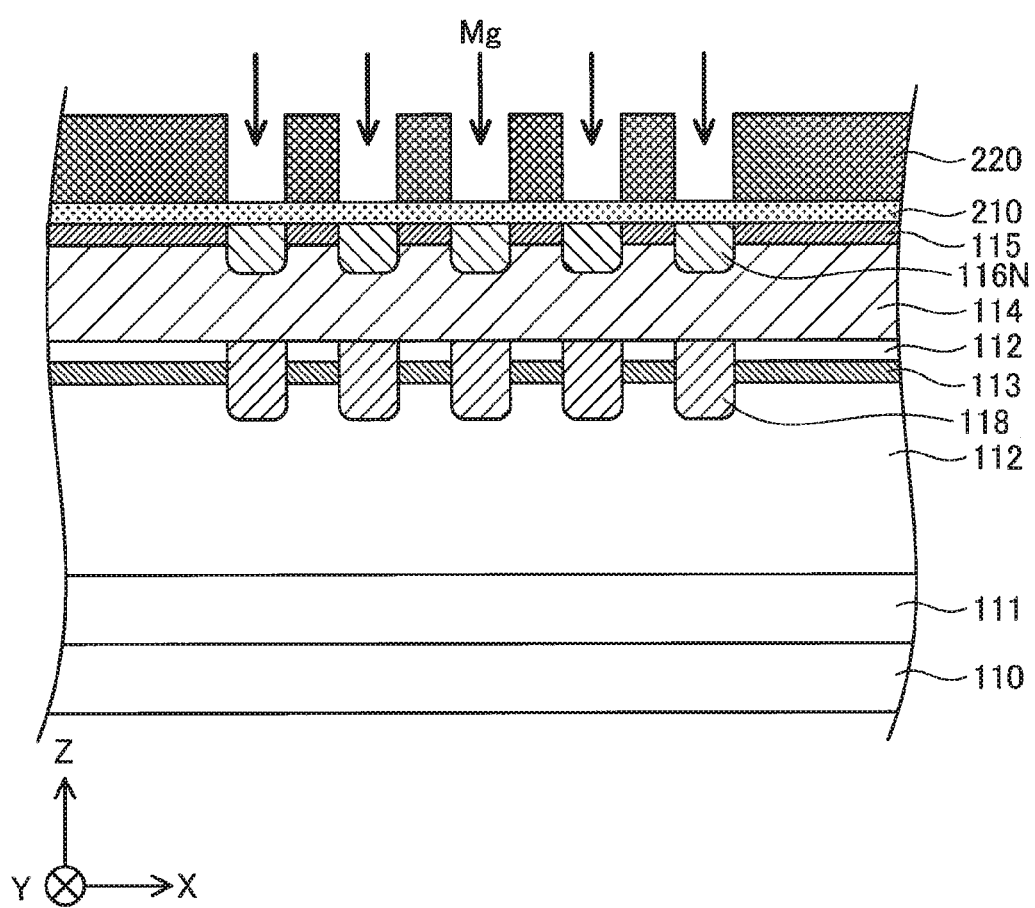
FIG. 5 is a sectional view of a semiconductor device according to a third embodiment, schematically illustrating a state of ion implantation in progress.

FIG. 5 is a sectional view of a semiconductor device according to a third embodiment, schematically illustrating a state of ion implantation in progress. In the third embodiment, the p-type impurity containing regions 118 are disposed in the edge termination region. In the third embodiment, the p-type impurity containing regions 118 have such a multiple-loop arrangement as to surround an active region where a transistor or a diode is formed. In this embodiment, the p-type impurity containing regions 118 have a five-loop arrangement. It should be noted that in place of the five-loop arrangement, a four or less-loop arrangement or a six or more-loop arrangement may be used. The p-type impurity containing regions 118 may not necessarily have the loop arrangement but may have discontinuous portions. In such a multiple arrangement, the number, widths, and intervals of the p-type impurity containing regions 118 may be changed to ensure formation of the edge termination region in accordance with desired properties.

D. Fourth Embodiment

Figure 6:
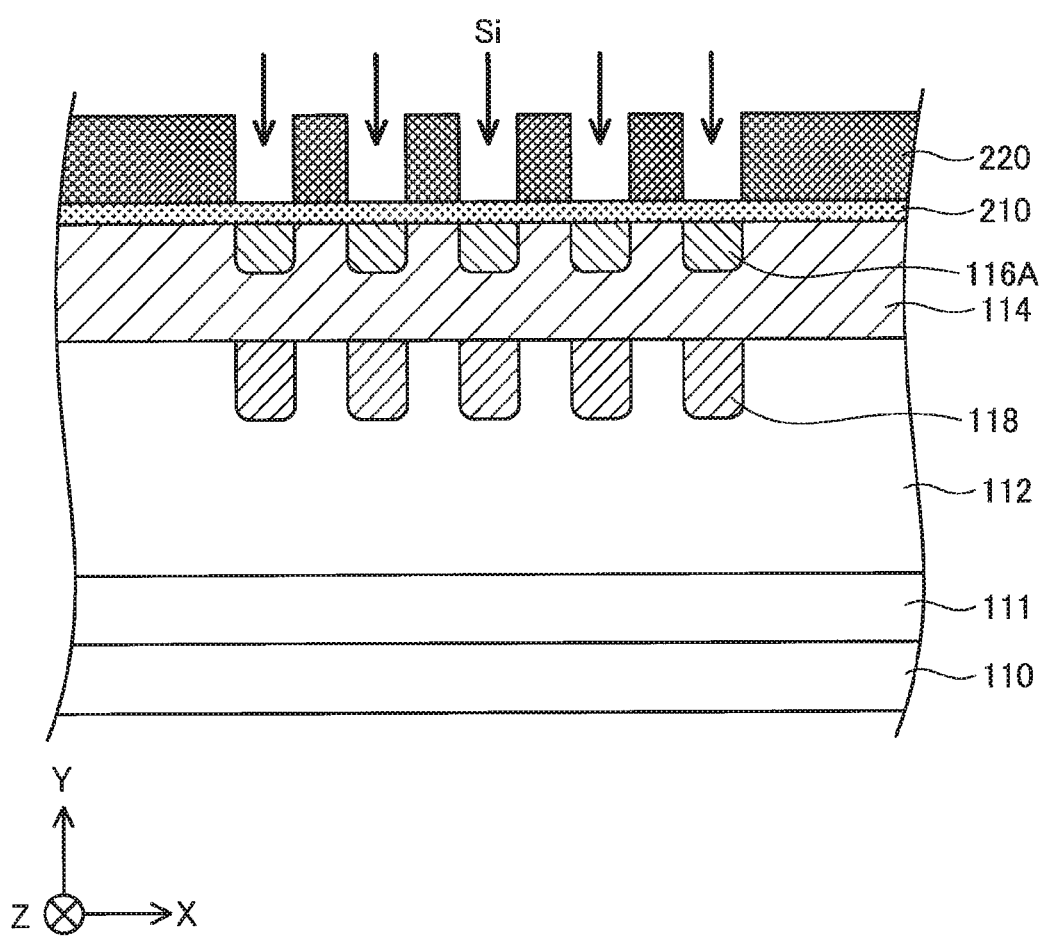
FIG. 6 is a sectional view of a semiconductor device according to a fourth embodiment, schematically illustrating a state of ion implantation in progress.

FIG. 6 is a sectional view of a semiconductor device according to a fourth embodiment, schematically illustrating a state of ion implantation in progress. The fourth embodiment differs from the third embodiment (see FIG. 4) in the following two respects: (i) the n-type semiconductor layer 113 and the n-type semiconductor layer 115 are not provided; and (ii) ion implantation is performed using silicon (Si) in place of magnesium (Mg) to provide ion-implanted regions 116A in place of the ion-implanted regions 116N. Otherwise, the fourth embodiment is similar to the third embodiment In the fourth embodiment, the ion-implanted regions 116A containing silicon (Si), which is an n-type impurity, are formed in the p-type semiconductor layer 114. The fourth embodiment also ensures that the p-type impurity containing regions 118 are formed in the n-type semiconductor layer 112 located in the edge termination region without ion implantation of the p-type impurity into the n-type semiconductor layer 112. It should be noted that although the semiconductor device according to the fourth embodiment includes a plurality of ion-implanted regions 116A and a plurality of p-type impurity containing regions 118, the semiconductor device may include a single ion-implanted region 116A and a single p-type impurity containing region 118.

Figure 7:
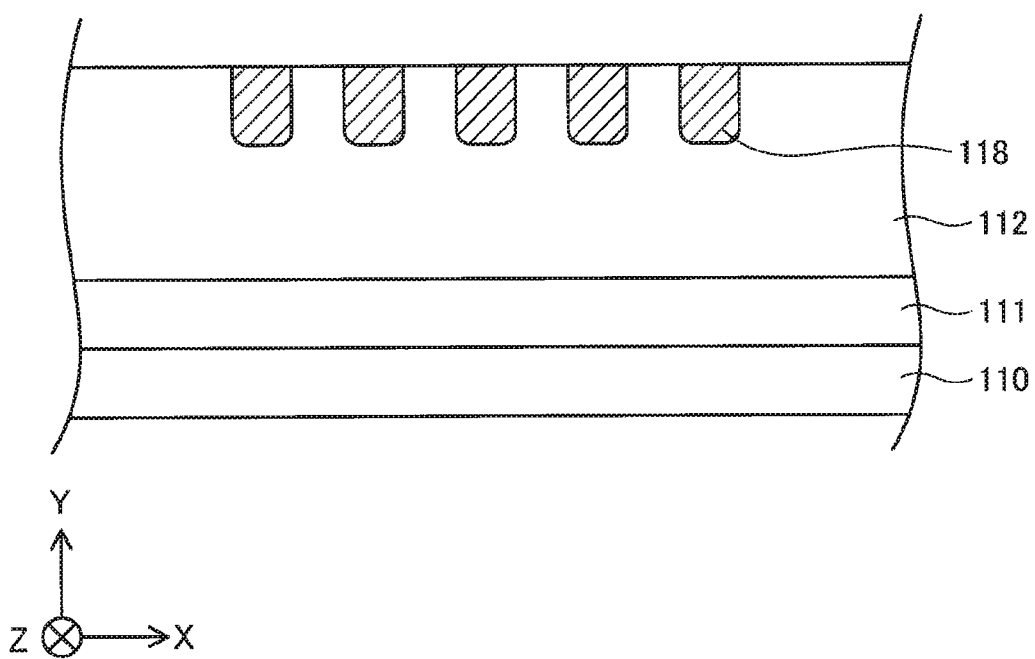
FIG. 7 is a schematic diagram illustrating a state of the semiconductor device according to the fourth embodiment from which layers such as an n-type semiconductor layer are removed.

FIG. 7 is a schematic diagram illustrating a state of the semiconductor device according to the fourth embodiment from which the p-type semiconductor layer 114 and its upper layers are removed by, for example, dry etching. Such a state may be adopted as a possible embodiment.

E. Fifth Embodiment

Figure 8:
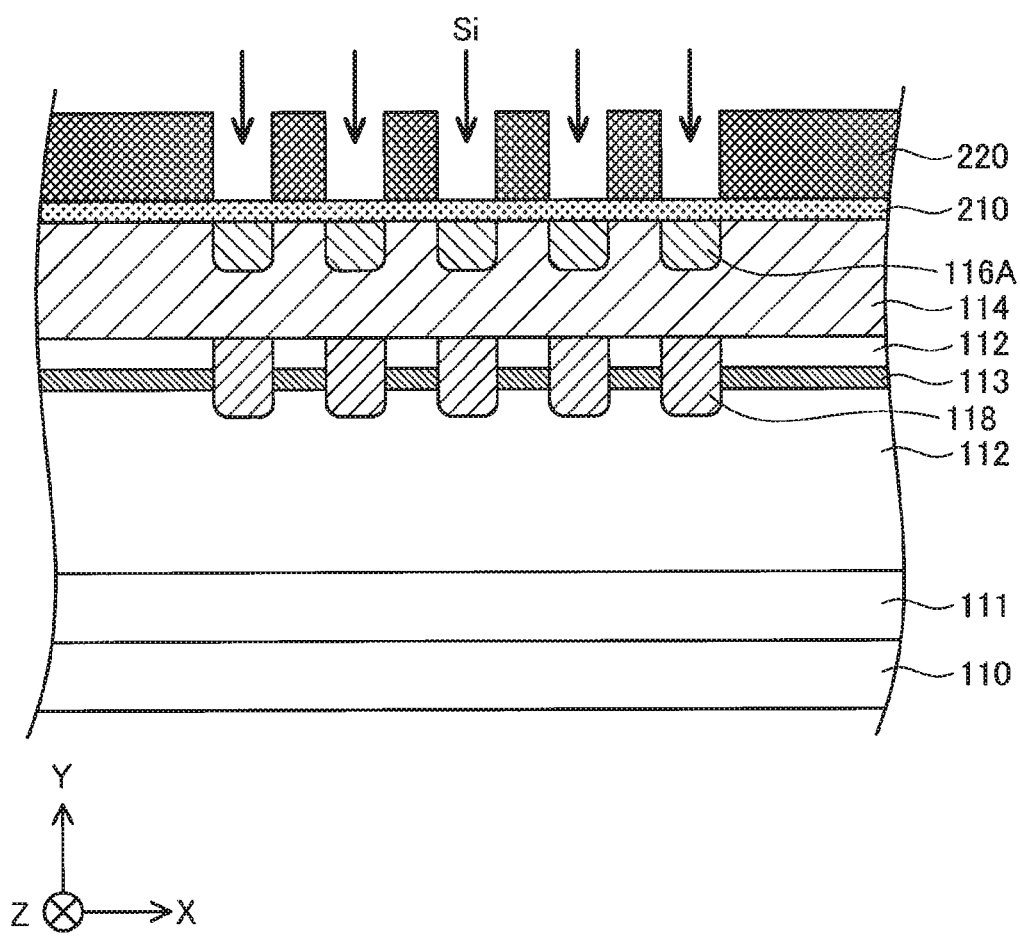
FIG. 8 is a sectional view of a semiconductor device according to a fifth embodiment, schematically illustrating a state of ion implantation in progress.

FIG. 8 is a sectional view of a semiconductor device according to a fifth embodiment, schematically illustrating a state of ion implantation in progress. The fifth embodiment differs from the fourth embodiment (see FIG. 6) in that the n-type semiconductor layer 113 having a larger concentration of the n-type impurity than the n-type semiconductor layers 112 is interposed between the n-type semiconductor layers 112. Otherwise, the fifth embodiment is similar to the fourth embodiment A method for manufacturing the semiconductor device according to the fifth embodiment also ensures that the p-type impurity containing regions 118 are formed in the n-type semiconductor layers 112 located in the edge termination region without ion implantation of the p-type impurity into the n-type semiconductor layers 112. It should be noted that although the n-type semiconductor layer 113 intersects the p-type impurity containing regions 118 in the fifth embodiment, the n-type semiconductor layer 113 may be disposed below the p-type impurity containing regions 118.

F. Sixth Embodiment

Figure 9A:
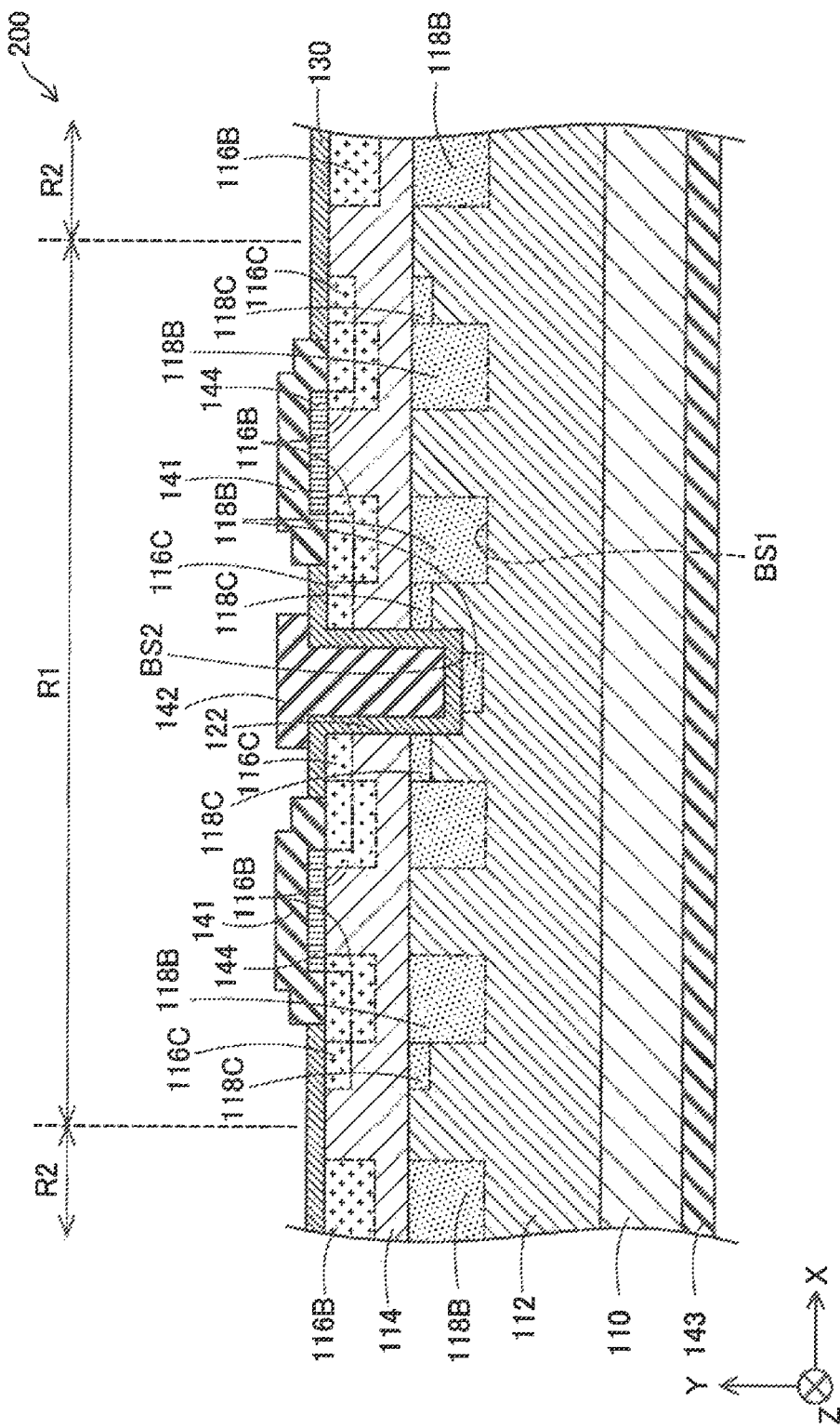
FIG. 9A is a sectional view of an exemplary aspect of a semiconductor device according to a sixth embodiment, schematically illustrating its configuration.
Figure 9B:
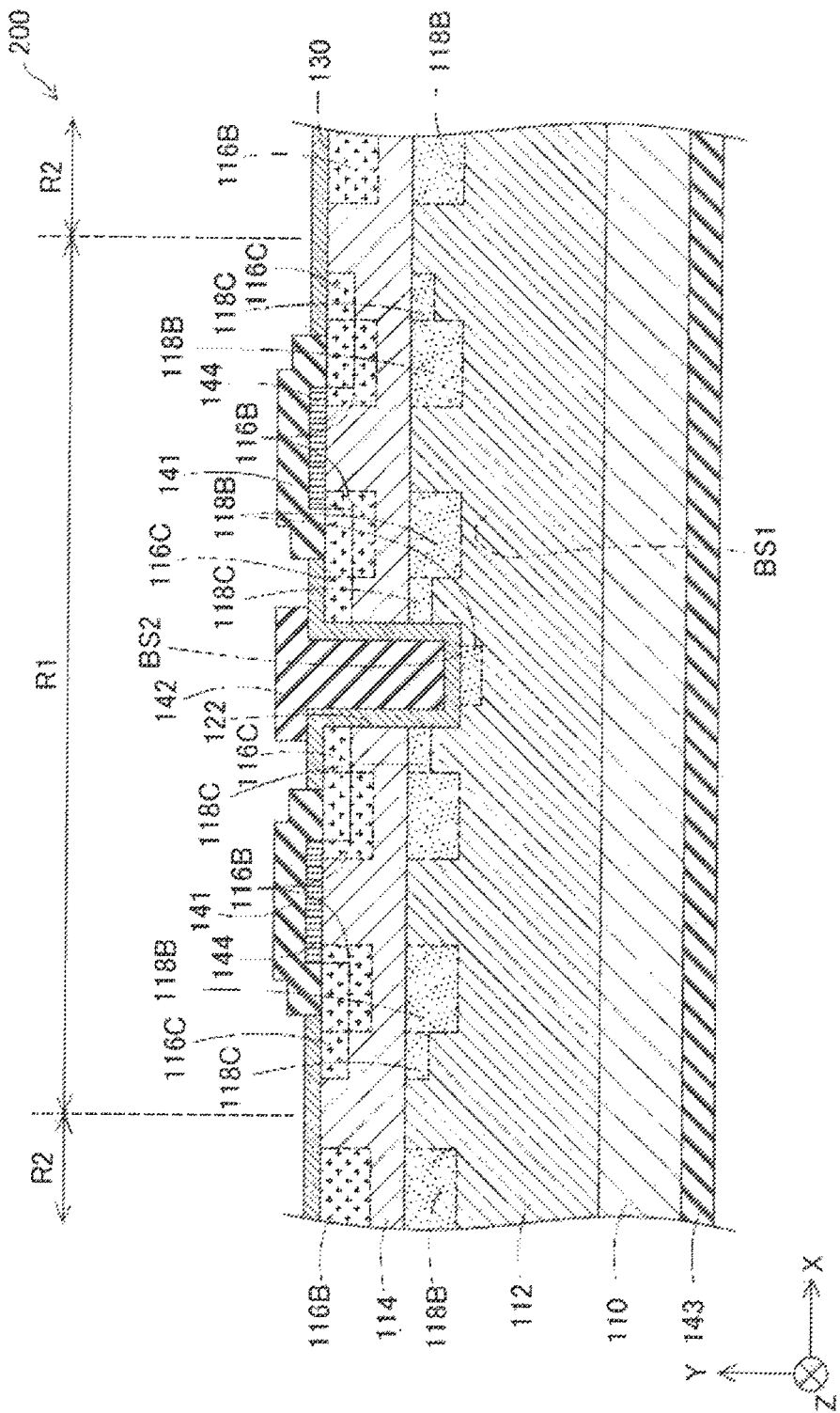
FIG. 9B is a sectional view of another exemplary aspect of a semiconductor device according to a sixth embodiment, schematically, illustrating its configuration.

FIG. 9A is a sectional view of a semiconductor device 200 according to a sixth embodiment, schematically illustrating its configuration. FIG. 9B is a sectional view of another aspect of the semiconductor device 200 according to a sixth embodiment, schematically illustrating its configuration. The semiconductor device 200 according to the sixth embodiment is a vertical trench MISFET (metal-insulator-semiconductor field-effect transistor) having a trench gate structure. Here, "trench gate structure" refers to a structure in which a trench is formed in a semiconductor layer, with at least part of a gate electrode being embedded in the trench. The semiconductor device 200 according to this embodiment is used for power control, and is referred to as power device as well. FIGS. 9A and 9B and the following drawings illustrate an active portion R1, which is an device cell region, and an edge termination region R2 surrounding the active portion R1.

In a method for manufacturing the semiconductor device 200 according to the sixth embodiment, ion implantation is performed twice. Specifically, as a first ion-implanted region forming process, ion implantation of silicon (Si) into the p-type semiconductor layer 114 is performed. As a result of the first ion implantation and heat treatment, ion-implanted regions 116B and p-type impurity containing regions 118B are formed. As a second ion-implanted region forming process, ion implantation of silicon (Si) into the p-type semiconductor layer 114 is performed. As a result of the second ion implantation and heat treatment, ion-implanted regions 116C and p-type impurity containing regions 118C are formed.

The ion implantation process are followed by a trench forming process of forming a trench 122, which is recessed to pass through the p-type semiconductor layer 114 and reach the n-type semiconductor layer 112. In the stacking direction (Z-axis direction) of the n-type semiconductor layer 112 and the p-type semiconductor layer 114, as shown in FIG. 9B, a bottom face BS1 of each of the p-type impurity containing regions 118B is located to be coplanar with a bottom face BS2 of the trench 122 or, as shown in FIG. 9A is located below (on the −Z-axis direction side of) the bottom face BS2 of the trench 122. In the sixth embodiment, in the stacking direction (Z-axis direction) of the n-type semiconductor layer 112 and the p-type semiconductor layer 114, the bottom face BS1 of each of the p-type impurity containing regions 118B is located below (on the −Z-axis direction side of) the bottom face BS2 of the trench 122. Here, "bottom face" refers to the furthest face of a region or layer concerned in the −Z-axis direction. Consequently, with the bottom faces BS1 in the active portion R1 being located below the bottom face BS2, potential crowding is suppressed in the vicinity of the outer periphery of the bottom face BS2 of the trench 122. Furthermore, with the bottom faces BS1 in the edge termination region R2 being located below the bottom face BS2 in the active portion R1, avalanche breakdown is caused in the edge termination region R2 before potential crowding in the vicinity of the trench 122 breaks the trench 122. This improves breakdown voltage of the semiconductor device 200.

In the trench forming process, the trench 122 is formed at a location overlapped with at least part of the p-type impurity containing region 118B in such a manner that at least part of the bottom face BS2 of the trench is formed by the p-type impurity containing region 118B. In the sixth embodiment, in the trench forming process, the trench 122 is formed at a location overlapped with part of the p-type impurity containing region 118B in such a manner that part of the bottom face BS2 of the trench is formed by the p-type impurity containing region 118B. Consequently, with the semiconductor device according to the sixth embodiment, potential crowding is more effectively suppressed in the vicinity of the outer periphery of the bottom face BS2 of the trench 122.

A method for manufacturing the semiconductor device 200 according to the sixth embodiment further includes the following four processes: (i) a process of forming an insulation film 130 inside of the trench 122; (ii) a process of forming source electrodes 141 (also referred to as first electrodes) and body electrodes 144, the source electrodes 141 and the body electrodes 144 being in contact with the ion-implanted regions 116B of the p-type semiconductor layer 114; (iii) a process of forming a drain electrode 143 (also referred to as second electrode) in contact with the n-type semiconductor layer, which is the substrate 110; and (iv) a process of forming a gate electrode 142 (also referred to as control electrode) on the insulation film 130, the gate electrode 142 serving to control a flow of electric current between the first electrodes and the second electrode.

The method for manufacturing the semiconductor device according to the sixth embodiment also ensures that the p-type impurity containing regions 118B are formed in the n-type semiconductor layer 112 located in the edge termination region R2 without ion implantation of the p-type impurity into the n-type semiconductor layer 112. At the same time as formation of the p-type impurity containing regions 118B in the edge termination region R2, the p-type impurity containing regions 118B in the active portion R1 are also formed effectively.

G. Seventh Embodiment

FIG. 10 is a sectional view of a semiconductor device 300 according to a seventh embodiment, schematically illustrating its configuration. The semiconductor device 300 according to the seventh embodiment differs from the semiconductor device 200 according to the sixth embodiment in the following two respects regarding the edge termination region: (i) the p-type impurity containing regions 118B are replaced with p-type impurity containing regions 118D; and (ii) the ion-implanted regions 116B are replaced with ion-implanted regions 116D. Otherwise, the semiconductor device 300 according to the seventh embodiment is similar to the semiconductor device 200 according to the sixth embodiment.

In the seventh embodiment, the bottom faces BS3 of the p-type impurity containing regions 118D in the edge termination region R2 are located below (on the −Z-axis direction side of) the bottom faces of the p-type impurity containing regions 118B in the edge termination region R2 in the sixth embodiment. The bottom faces BS3 of the p-type impurity containing regions 118D in the edge termination region R2 are located below (on the −Z-axis direction side of) the bottom face BS2 of the trench 122. The bottom faces BS3 of the p-type impurity containing regions 118D in the edge termination region R2 are located below (on the −Z-axis direction side of) the bottom faces BS1 of the p-type impurity containing regions 118B in the active portion R1. According to the seventh embodiment, breakdown voltage of the semiconductor device 300 is improved more effectively. The p-type impurity containing regions 118D of the semiconductor device 300 are formed by adjusting depth of ion implantation. More specifically, accelerating voltage is made higher than accelerating voltage in ion implantation into the active portion R1 so as to form the p-type impurity containing regions 118D more deeply at a lower level in the edge termination region R2.

A method for manufacturing the semiconductor device 300 according to the seventh embodiment also ensures that the p-type impurity containing regions 118D are formed in the n-type semiconductor layer 112 located in the edge termination region R2 without ion implantation of the p-type impurity into the n-type semiconductor layer 112.

H. Eighth Embodiment

FIG. 11 is a sectional view of a semiconductor device 400 according to an eighth embodiment, schematically illustrating its configuration. The semiconductor device 400 according to the eighth embodiment differs from the semiconductor device 200 according to the sixth embodiment by including recesses 128 in the edge termination region R2. Otherwise, the semiconductor device 400 according to the eighth embodiment is similar to the semiconductor device 200 according to the sixth embodiment.

A method for manufacturing the semiconductor device 400 according to the eighth embodiment also ensures that p-type impurity containing regions 118E are formed in the n-type semiconductor layer 112 located in the edge termination region R2 without ion implantation of the p-type impurity into the n-type semiconductor layer 112. It should be noted that since the ion-implanted regions 116B are formed after forming the recesses 128, the method for manufacturing the semiconductor device 400 according to the eighth embodiment is substantially the same as the manufacturing method according to the sixth embodiment except for forming the recesses 128. Bottom faces BS4 of the p-type impurity containing regions 118E in the edge termination region R2 are located below the bottom faces BS1 of the p-type impurity containing regions 118B in the active portion R1. This improves breakdown voltage.

I. Other Embodiments

The present disclosure is not limited to the embodiments and examples described above but may be implemented by a diversity of other configurations without departing from the scope of the present disclosure. For example, the technical features of the embodiments corresponding to the technical features of the aspects described in SUMMARY may be replaced or combined appropriately so as to solve some or all of the circumstances described above or to achieve some or all of the advantageous effects described above. The technical features may be omitted appropriately unless the technical feature concerned is described as essential herein.

In the first embodiment, no other layers are interposed between the substrate 110 and the n-type semiconductor layer 112. Other layers, however, may be interposed between these two layers. As other layers, the following three examples may be employed: (i) an n-type semiconductor layer (having an n-type impurity concentration of $5.0 \times 10^{18}$ cm$^{-3}$ and a thickness of 0.5 μm to 1 μm) having an n-type impurity concentration higher than the n-type semiconductor layer 112; (ii) a layer to reduce lattice mismatching, which layer includes an aluminum nitride (AlN) layer and a gallium nitride (GaN) layer in sequence from contact with the substrate 110; and (iii) a low-temperature deposition buffer layer. When the n-type semiconductor layer 111, which has an n-type impurity concentration higher than the n-type semiconductor layer 112, is interposed between the substrate 110 and the n-type semiconductor layer 112, and when the substrate 110 is an insulator, the n-type semiconductor layer 111, which has an n-type impurity concentration higher than the n-type semiconductor layer 112, serves as a drain contact layer, and a drain electrode is formed to be in contact with the drain contact layer.

In the first embodiment, no other layers are interposed between the n-type semiconductor layer 112 and the p-type semiconductor layer 114. Other layers, however, may be interposed between these two layers. As other layers, for example, the n-type semiconductor layer 113 (having an n-type impurity concentration of $5.0 \times 10^{17}$ cm$^{-3}$ or less and a thickness of 1 μm or less) having an n-type impurity concentration higher than the n-type semiconductor layer 112 may be used. The n-type semiconductor layer 113 prevents built-in potential from the p-type impurity containing region 118 from depleting the n-type semiconductor layer 112 and hindering electron transfer.

In the first embodiment, no semiconductor layer is disposed on the p-type semiconductor layer 114. Other layers, however, may be disposed on the p-type semiconductor layer 114. As other layers, for example, the n-type semiconductor layer 115 (having an n-type impurity concentration of $5.0 \times 10^{18}$ cm$^{-3}$ and a thickness of 0.5 μm or less) having a high n-type impurity concentration may be used. This layer serves as a source contact layer.

In the sixth to eighth embodiments, the semiconductor devices to which the present disclosure is applied are not limited to the vertical trench MISFETs described in the above embodiments. The semiconductor device to which the present disclosure is applied may be a semiconductor device having a trench gate structure of, for example, an insulated gate bipolar transistor (IGBT), and using a principle of forming an inverted layer by a control electrode so as to control current.

In the above-described embodiments, silicon (Si) is employed as the n-type impurity. The present disclosure, however, is not limited to this. As the n-type impurity, for example, oxygen (O) or germanium (Ge) may be employed.

What is claimed is:

1. An edge termination structure of a semiconductor device, the edge termination structure comprising:
   an n-type semiconductor layer containing an n-type impurity;
   a p-type semiconductor layer formed on the n-type semiconductor layer and containing a p-type impurity;
   a first region formed in the p-type semiconductor layer and containing a larger amount of at least one of the n-type impurity and the p-type impurity than another region of the p-type semiconductor layer; and a p-type impurity containing region formed in the n-type semiconductor layer and below the first region, and containing the p-type impurity, wherein an upper surface of the first region is flush with an upper surface of the p-type semiconductor layer, wherein a p-type impurity concentration of the p-type impurity containing region is less than a p-type impurity concentration of said another region of the p-type semiconductor layer, wherein, in a stacking direction of the n-type semiconductor layer and the p-type semiconductor layer, outer edges of the first region align with outer edges of the p-type impurity containing region, and wherein the first region includes the n-type impurity.

2. The edge termination structure in accordance with claim 1, wherein, in the stacking direction of the n-type semiconductor layer and the p-type semiconductor layer, an entirety of the p-type impurity containing region overlaps with the first region.

3. The edge termination structure in accordance with claim 1, wherein the p-type impurity containing region contains silicon.

4. The edge termination structure in accordance with claim 3, wherein the p-type impurity containing region further contains magnesium as the p-type impurity.

5. The edge termination structure in accordance with claim 1, further comprising:

an insulation film disposed on the upper surface of the first region and the upper surface of the p-type semiconductor layer.

6. The edge termination structure in accordance with claim 5, wherein the insulation film abuts the upper surface of the first region and the upper surface of the p-type semiconductor layer.

7. The edge termination structure in accordance with claim 1, further comprising:

a trench that passes through the p-type semiconductor layer and reaches the n-type semiconductor layer.

8. The edge termination structure in accordance with claim 7, wherein, in the stacking direction of the n-type semiconductor layer and the p-type semiconductor layer, a bottom surface of the p-type impurity containing region is coplanar with a bottom surface of the trench.

9. The edge termination structure in accordance with claim 7, wherein, in the stacking direction of the n-type semiconductor layer and the p-type semiconductor layer, a bottom surface of the p-type impurity containing region is located below a bottom surface of the trench.

10. The edge termination structure in accordance with claim 7, wherein, with respect to a bottom surface of the n-type semiconductor layer, a bottom surface of the first region is located higher than a bottom surface of the trench.

11. The edge termination structure in accordance with claim 1, wherein the n-type semiconductor layer and the p-type semiconductor layer comprise a Group III nitride.

12. The edge termination structure in accordance with claim 1, further comprising a trench that is recessed to pass through the p-type semiconductor layer and to reach the n-type semiconductor layer, wherein, in the stacking direction of the n-type semiconductor layer and the p-type semiconductor layer, a bottom face of the p-type impurity containing region is located to be coplanar with a bottom face of the trench.

13. A method for manufacturing a semiconductor device including an edge termination region, the method comprising:

a stacking process that stacks a p-type semiconductor layer containing a p-type impurity on an n-type semiconductor layer containing an n-type impurity;

an ion implantation process that ion-implants at least one of the n-type impurity and the p-type impurity into a region of the p-type semiconductor layer located in the edge termination region; and a heat treatment process that performs a heat treatment to activate the ion-implanted impurity, wherein the ion implantation process and the heat treatment process are performed such that the p-type impurity of the p-type semiconductor layer is diffused into the n-type semiconductor layer to form a p-type impurity containing region in at least a part of the n-type semiconductor layer and below a region of the p-type semiconductor layer into which the ion implantation has been performed, wherein a p-type impurity concentration of the p-type impurity containing region is less than a p-type impurity concentration of an area of the p-type semiconductor layer located outside of the region and of the p-type semiconductor layer that is ion implanted in the ion implantation process, and wherein, in the ion implantation process, the n-type impurity is implanted into the p-type semiconductor layer.

14. The method for manufacturing the semiconductor device in accordance with claim 13, further comprising:

a trench forming process that forms a trench that is recessed to pass through the p-type semiconductor layer and reach the n-type semiconductor layer, wherein, in a stacking direction of the n-type semiconductor layer and the p-type semiconductor layer, a bottom face of the p-type impurity containing region is located to be coplanar with a bottom face of the trench or below the bottom face of the trench.

15. The method for manufacturing the semiconductor device in accordance with claim 14, wherein, in the stacking direction of the n-type semiconductor layer and the p-type semiconductor layer, the bottom face of the p-type impurity containing region is located to be coplanar with the bottom face of the trench.

16. The method for manufacturing the semiconductor device in accordance with claim 14, wherein, in the stacking direction of the n-type semiconductor layer and the p-type semiconductor layer, the bottom face of the p-type impurity containing region is located below the bottom face of the trench.

17. The method for manufacturing the semiconductor device in accordance with claim 13, wherein the n-type semiconductor layer and the p-type semiconductor layer comprise a Group III nitride.

18. A method for manufacturing a semiconductor device including an edge termination region, the method comprising:

a stacking process that stacks a p-type semiconductor layer containing a p-type impurity on an n-type semiconductor layer containing an n-type impurity;

an ion implantation process that ion-implants at least one of the n-type impurity and the p-type impurity into a region of the p-type semiconductor layer located in the edge termination region; and a heat treatment process that performs a heat treatment to activate the ion-implanted impurity, wherein the ion implantation process and the heat treatment process are performed such that the p-type impurity of the p-type semiconductor layer is diffused into the n-type semiconductor layer to form a p-type impurity containing region in at least a part of the n-type semiconductor layer and below a region of the p-type semiconductor layer into which the ion implantation has been performed, wherein a p-type impurity concentration of the p-type impurity containing region is less than a p-type impurity concentration of an area of the p-type semiconductor layer located outside of the region of the p-type semiconductor layer that is ion implanted in the ion implantation process, and wherein the ion implantation process ion-implants the n-type impurity and the p-type impurity into the p-type semiconductor layer located in the edge termination region.

* * * * *